(12) United States Patent
Quinn (10) Patent No.: US 10,001,808 B1
(45) Date of Patent: Jun. 19, 2018

(54) MOBILE DEVICE ACCESSORY EQUIPPED TO COMMUNICATE WITH MOBILE DEVICE

(71) Applicant: Google LLC, Mountain View, CA (US)

(72) Inventor: Philip Quinn, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days. days.

(21) Appl. No.: 15/472,716

(22) Filed: Mar. 29, 2017

(51) Int. Cl.
*H04B 5/00* (2006.01)
*G06F 1/16* (2006.01)
*H01L 41/113* (2006.01)
*H04B 7/0404* (2017.01)
*H04B 1/3888* (2015.01)
*H04B 1/3883* (2015.01)

(52) U.S. Cl.
CPC ........ *G06F 1/1635* (2013.01); *H01L 41/1132* (2013.01); *H04B 1/3883* (2013.01); *H04B 1/3888* (2013.01); *H04B 5/0037* (2013.01); *H04B 7/0404* (2013.01)

(58) Field of Classification Search
USPC ........................ 455/41.1–41.3, 575.8, 90.3
See application file for complete search history.

(56) References Cited

U.S. PATENT DOCUMENTS

| | | | |
|---|---|---|---|
| 5,648,757 A | 7/1997 | Vernace et al. | |
| 6,392,584 B1 | 5/2002 | Eklund | |
| 6,414,619 B1 | 7/2002 | Swanson | |
| 6,526,801 B2 | 3/2003 | Kouznestsov | |
| 6,747,573 B1 * | 6/2004 | Gerlach | G08C 17/02 340/7.49 |
| 6,823,200 B2 * | 11/2004 | Rekimoto | H04M 1/72519 178/19.01 |
| 7,546,772 B2 | 6/2009 | Cabuz et al. | |
| 7,974,500 B2 | 6/2011 | Silverbrook et al. | |

(Continued)

FOREIGN PATENT DOCUMENTS

| | | |
|---|---|---|
| EP | 2175344 | 4/2010 |
| EP | 2175625 | 4/2010 |

(Continued)

OTHER PUBLICATIONS

International Search Report and Written Opinion issued in International Application No. PCT/US2017/047065, dated Nov. 10, 2017, 13 pages.

(Continued)

*Primary Examiner* — Edward Urban
*Assistant Examiner* — Rui Hu
(74) *Attorney, Agent, or Firm* — Fish & Richardson P.C.

(57) ABSTRACT

A smartphone case can include one or more piezotransductive materials (e.g., piezoelectric, piezomagnetic, piezoluminescent, etc.) positioned at one or more contact locations of the smartphone case. For example, a piezoelectric material can be positioned at multiple different locations of the smartphone case at which users may physically contact the smartphone case when holding the case. The piezoelectric material can generate an electric charge when pressure is applied to the material, and the generated electric charge can pass through an electromagnetic coil as an electric current to produce a magnetic field which one or more sensors (e.g., one or more magnetometers) of a smartphone that is housed within the smartphone case may be able to detect.

17 Claims, 5 Drawing Sheets

(56) References Cited

U.S. PATENT DOCUMENTS

| | | | |
|---|---|---|---|
| 8,078,884 B2 | 12/2011 | Ramatishnan | |
| 8,417,303 B2* | 4/2013 | Ladouceur | H01H 9/04 |
| | | | 455/575.8 |
| 8,442,602 B2* | 5/2013 | Wong | H01Q 1/243 |
| | | | 343/702 |
| 8,536,765 B2* | 9/2013 | Oh | H04M 1/72522 |
| | | | 310/314 |
| 8,539,765 B2 | 9/2013 | Oh et al. | |
| 8,559,086 B2 | 10/2013 | Davis et al. | |
| 9,304,948 B2 | 4/2016 | Whitman et al. | |
| 9,411,451 B2 | 8/2016 | Myers et al. | |
| 9,460,029 B2 | 10/2016 | Shaw et al. | |
| 9,465,412 B2 | 10/2016 | Belesiu et al. | |
| 2003/0026971 A1 | 2/2003 | Inkster et al. | |
| 2003/0210235 A1 | 11/2003 | Roberts | |
| 2004/0125079 A1 | 7/2004 | Kaneko et al. | |
| 2004/0203500 A1 | 10/2004 | Wong et al. | |
| 2004/0203503 A1* | 10/2004 | Rollins | G04B 25/04 |
| | | | 455/90.3 |
| 2006/0028459 A1 | 2/2006 | Underwood et al. | |
| 2006/0293864 A1 | 12/2006 | Soss | |
| 2008/0053713 A1 | 3/2008 | Huang et al. | |
| 2008/0166966 A1* | 7/2008 | Hamasaki | H04B 1/3805 |
| | | | 455/41.2 |
| 2009/0259969 A1 | 10/2009 | Pallakoff | |
| 2009/0312051 A1* | 12/2009 | Hansson | G06F 1/1626 |
| | | | 455/556.1 |
| 2009/0315745 A1 | 12/2009 | McLoughlin | |
| 2010/0015918 A1* | 1/2010 | Liu | H04B 5/00 |
| | | | 455/41.1 |
| 2010/0085724 A1* | 4/2010 | Park | H04M 1/23 |
| | | | 361/810 |
| 2010/0113111 A1* | 5/2010 | Wong | H01Q 1/243 |
| | | | 455/575.5 |
| 2010/0123686 A1 | 5/2010 | Klinghult et al. | |
| 2010/0201635 A1 | 8/2010 | Klinghult et al. | |
| 2011/0069024 A1 | 3/2011 | Kim | |
| 2011/0080367 A1 | 4/2011 | Marchand et al. | |
| 2011/0227726 A1 | 9/2011 | Lee | |
| 2012/0098530 A1 | 4/2012 | Saito et al. | |
| 2013/0002565 A1 | 1/2013 | Tumanov et al. | |
| 2013/0009905 A1 | 1/2013 | Castillo et al. | |
| 2013/0076646 A1 | 3/2013 | Krah et al. | |
| 2013/0135223 A1 | 5/2013 | Shai | |
| 2013/0154998 A1 | 6/2013 | Yang et al. | |
| 2013/0160567 A1* | 6/2013 | Ota | G01L 1/18 |
| | | | 73/862.68 |
| 2013/0176265 A1* | 7/2013 | Zurek | G06F 1/3262 |
| | | | 345/174 |
| 2013/0211740 A1 | 8/2013 | Ramamurthy et al. | |
| 2013/0283378 A1 | 10/2013 | Costigan et al. | |
| 2013/0300668 A1 | 11/2013 | Churikov et al. | |
| 2014/0000386 A1 | 1/2014 | Malhan et al. | |
| 2014/0008999 A1* | 1/2014 | Prest | G01L 1/22 |
| | | | 307/119 |
| 2014/0042873 A1* | 2/2014 | Shen | G06F 1/26 |
| | | | 310/339 |
| 2014/0073378 A1* | 3/2014 | Coverstone | H04M 1/0283 |
| | | | 455/575.8 |
| 2014/0200054 A1* | 7/2014 | Fraden | H04M 1/0254 |
| | | | 455/575.8 |
| 2014/0217853 A1* | 8/2014 | Mankowski | H02N 2/18 |
| | | | 310/319 |
| 2015/0069126 A1 | 3/2015 | Leon | |
| 2015/0119114 A1* | 4/2015 | Smith | G06F 1/16 |
| | | | 455/566 |
| 2015/0207436 A1* | 7/2015 | Lee | H02N 2/186 |
| | | | 310/339 |
| 2015/0257158 A1* | 9/2015 | Jadhav | H04W 4/90 |
| | | | 455/404.1 |
| 2015/0296622 A1* | 10/2015 | Jiang | G01L 1/2268 |
| | | | 361/750 |
| 2015/0317076 A1 | 11/2015 | Goel et al. | |
| 2015/0331522 A1 | 11/2015 | McMillen | |
| 2016/0084674 A1 | 3/2016 | Cambou et al. | |
| 2016/0191103 A1* | 6/2016 | Balaji | B65D 25/00 |
| | | | 455/575.8 |
| 2016/0216164 A1 | 7/2016 | Teil | |
| 2017/0031495 A1 | 2/2017 | Smith | |
| 2017/0038905 A1 | 2/2017 | Bijamov et al. | |

FOREIGN PATENT DOCUMENTS

| | | |
|---|---|---|
| EP | 2672368 | 12/2013 |
| EP | 2784521 | 1/2014 |
| EP | 2784630 | 10/2014 |
| EP | 2801889 | 11/2014 |
| GB | 1391830 | 4/1975 |
| WO | 2006/035342 | 4/2006 |
| WO | 2010/058301 | 5/2010 |
| WO | WO 2015/047616 | 4/2015 |
| WO | 2015/130040 | 9/2015 |
| WO | WO 2015/179262 | 11/2015 |
| WO | WO 2016/027113 | 2/2016 |
| WO | WO 2016/154762 | 10/2016 |
| WO | WO 2017/011810 | 1/2017 |

OTHER PUBLICATIONS

International Search Report and Written Opinion issued in International Application No. PCT/US2017/057904, dated Jan. 19, 2018, 16 pages.

Invitation to Pay Additional Fees and, Where Applicable, Protest Fees issued in International Application No. PCT/US2017/065304, dated Feb. 27, 2018, 26 pages.

Invitation to Pay Additional Fees and, Where Applicable, Protest Fees issued in International Application No. PCT/US2017/064916, dated Mar. 5, 2018, 15 pages.

International Search Report and Written Opinion issued in International Application No. PCT/US2017/065307, dated Mar. 7, 2018, 14 pages.

* cited by examiner

MOBILE DEVICE ACCESSORY EQUIPPED TO COMMUNICATE WITH MOBILE DEVICE

BACKGROUND

Mobile devices such as smartphones and tablets have become ubiquitous in modern society. People use such devices to perform various tasks, including communicating with other users verbally or through text based communications (e.g., with telephone calls, SMS messaging, email, or social media); accessing web pages; finding nearby attractions or places of interest; obtaining travel routes; and taking pictures and videos. In addition, mobile device accessories that are provided by mobile device manufacturers or third parties can provide additional functionality for mobile devices, protect mobile devices (e.g., as a mobile device case), or both. In some instances, mobile device accessories can communicate with one or more mobile devices. Communication between a mobile device and a mobile device accessory generally requires that the mobile device accessory be connected to a power supply (e.g., through a direct electrical connection with the mobile device, with an external power source, or with a separate power supply within the mobile device accessory). Communication between a mobile device and a mobile device accessory also generally requires either a physical electrical connection between the mobile device accessory and the mobile device (e.g., using one or more wires connected between the mobile device accessory and a port of the mobile device) or through use of a wireless communication protocol such as a WiFi or BLUETOOTH.

SUMMARY

This document describes techniques, methods, systems, and other mechanisms for providing wireless communication between an unpowered mobile device accessory and a mobile computing device. For example, a smartphone case can include one or more piezotransductive materials (e.g., piezoelectric, piezomagnetic, piezoluminescent, etc.) positioned at one or more contact locations of the smartphone case. For example, a piezoelectric material can be positioned at multiple different locations of the smartphone case at which users may physically contact the smartphone case when holding the case. The piezoelectric material can generate an electric charge when pressure is applied to the material, and the generated electric charge can pass through an electromagnetic coil as an electric current to produce a magnetic field which one or more sensors (e.g., one or more magnetometers) of a smartphone that is housed within the smartphone case may be able to detect.

In general, in one aspect, a mobile device accessory includes first and second opposing side walls for engaging respective edges of a mobile computing device; a first plurality of contact locations positioned along the first side wall, each of the first plurality of contact locations including piezoelectric material configured to produce an electric current in response to application of mechanical stress; a second plurality of contact locations positioned along the second side wall, each of the second plurality of contact locations including piezoelectric material configured to produce an electric current in response to application of mechanical stress; and a plurality of electromagnetic coils, each of the plurality of electromagnetic coils in electric communication with the piezoelectric material of a distinct one of the first plurality of contact locations or the second plurality of contact locations, each respective electromagnetic coil of the plurality of electromagnetic coils configured to produce a respective magnetic field in response to receiving the respective electric current produced by the respective piezoelectric material in contact with the respective electromagnetic coil.

These and other embodiments can each optionally include one or more of the following features. The first plurality of contact locations can include three or more contact locations positioned along the first side wall and the second plurality of contact locations can include three or more contact locations positioned along the second side wall. The first plurality of contact locations can be substantially equidistantly spaced and the second plurality of contact locations can be substantially equidistantly spaced. The piezoelectric material can be configured to produce electric charge that increases in voltage as the mechanical stress placed upon the piezoelectric material increases. The magnetic fields produced by each of the plurality of electromagnetic coils can overlap at a particular location when each of the contact locations receives pressure that surpasses a threshold pressure value.

In general, in another aspect, a mobile device accessory includes a first inner surface for engaging an outer surface of a mobile computing device; a piezoelectric material positioned at least partially within the mobile device accessory such that when user input applies pressure to a first outer surface opposite the first inner surface, the piezoelectric material experiences mechanical stress and produces an electric current in response to the mechanical stress; and an electromagnetic coil that is in electric communication with the piezoelectric material and that is configured to produce a magnetic field in response to the electric current produced by the piezoelectric material.

These and other embodiments can each optionally include one or more of the following features. The piezoelectric material can be configured to produce electric current that increases in voltage as the mechanical stress placed upon the piezoelectric material increases. The mobile device accessory can be a case for the mobile computing device. The piezoelectric material can include a first portion of piezoelectric material. The mobile device accessory can further include a second portion of piezoelectric material positioned at least partially within the mobile device accessory such that when user input applies pressure to the mobile device accessory at a location near the second portion of piezoelectric material, the second portion of piezoelectric material experiences mechanical stress and produces an electric current in response to the mechanical stress; and a second electromagnetic coil that is in electric communication with the second portion of piezoelectric material and that is configured to produce a magnetic field in response to the electric current produced by the second portion of piezoelectric material. The first portion of piezoelectric material and the second portion of piezoelectric material can be positioned equidistantly from a reference location.

The reference location can represent the location of a magnetometer of the mobile computing device in at least one of a vertical or horizontal direction with respect to the mobile device accessory when the mobile device accessory is coupled to the mobile computing device. The reference location can be the location of a magnetometer of the mobile computing device when the mobile device accessory is coupled to the mobile computing device. The magnetic field produced by the electromagnetic coil can overlap with the magnetic field produced by the second electromagnetic coil at the reference location when pressure that exceeds a threshold pressure is applied to each of the first and second portions of piezoelectric material. The first portion of piezoelectric material can be positioned within a first wall of the mobile device accessory, the first wall being configured to engage a first edge of the mobile computing device. The second portion of piezoelectric material can be positioned within a second wall of the mobile device accessory, the second wall being configured to engage a second edge of the mobile computing device. The first portion of piezoelectric material can be electrically isolated from the second portion of piezoelectric material.

The mobile device accessory can further include an electrically non-conductive material that defines the first inner surface and first outer surface, the first and second portions of piezoelectric material can be positioned within the electrically non-conductive material and being electrically isolated by the electrically non-conductive material. The mobile device accessory can further include a diode along an electrical connection between the piezoelectric material and the electromagnetic coil. The mobile device accessory can further include a capacitor along an electrical connection between the piezoelectric material and the electromagnetic coil. The mobile device accessory can further include a voltage limiter along an electrical connection between the piezoelectric material and the electromagnetic coil.

In general, in another aspect, a mobile device accessory include configured to engage a computing device includes an electrically non-conductive material; a piezoelectric material configured to generate an electric current in response to mechanical stress, the piezoelectric material coupled to the electrically non-conductive material; and an electromagnetic coil at least partially embedded within the electrically non-conductive material, the electromagnetic coil being in electric communication with the piezoelectric material and being configured to produce a magnetic field in response to the electric current produced by the piezoelectric material.

These and other embodiments can each optionally include one or more of the following features. The computing device accessory can include a first wire connecting a first section of the piezoelectric material to a first end of the electromagnetic coil and a second wire connecting a second section of the piezoelectric material to a second end of the electromagnetic coil. The electromagnetic coil can be configured to produce the magnetic field such that the magnetic field can be sensed by a magnetometer of the computing device when the computing device accessory is releasably coupled to the computing device.

Particular implementations can, in certain instances, realize one or more of the following advantages. A mobile device accessory and a mobile device can communicate without the mobile device accessory having to be connected to a power source or have a power supply. A mobile device accessory can wirelessly communicate with a mobile device without the mobile device accessory requiring batteries that may need to be replaced or charged. A mobile device can receive communications from a mobile device accessory without a direct, physical, electrical connection to the mobile device accessory, and without relying on a wireless communication protocol that digitally transmits bytes of data, such as WiFi or BLUETOOTH. A user can provide input to a mobile computing device having a case without having to remove the case and without having to access input keys or buttons of the mobile computing device that protrude through apertures of the mobile device case. In other words, the user may contact or otherwise interact with the case to provide input to the mobile device. An unpowered mobile device accessory can wirelessly communicate with a mobile computing device without the mobile computing device having to include specialized hardware for communicating with the mobile device accessory. A durable case for a mobile computing device can communicate with a mobile computing device without the mobile computing device case having to include fragile computing components. A mobile device accessory can be manufactured more efficiently and cost efficiently because the mobile device accessory does not require expensive electronic and/or computing components for facilitating communications between the mobile device accessory and a mobile computing device.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

This document generally describes devices, systems, and methods for receiving user input at an unpowered mobile device accessory and communicating the user input to a mobile computing device. In some implementations, a mobile device accessory has one or more contact locations that include piezotransductive materials (e.g., piezoelectric, piezomagnetic, piezoluminescent) positioned in or on the mobile device accessory. For example, piezoelectric material can be positioned at multiple, different contact locations of the mobile computing device, and can be separated by non-piezoelectric material and can be at least partially electrically isolated from each other. The piezoelectric material positioned at each contact location can generate an electric charge when pressure is applied to the piezoelectric material. Each portion of piezoelectric material can be in electrical communication with an electromagnetic coil, such that the electric charge generated by each portion of piezoelectric material can pass through its respective electromagnetic coil as an electric current to produce a magnetic field. The produced magnetic field can be sensed by one or more sensors (e.g., one or more magnetometers) of a mobile device located near (or partially encompassed by) the mobile device accessory.

In some implementations, the mobile device accessory can take the form of a mobile phone case. The phone case can include an equal number of contact locations on either side, with the contact locations on each side being substantially equally spaced apart. Each contact location of the phone case includes piezoelectric material that is electronically coupled to an electromagnetic coil. The phone case can be removably coupled to a mobile phone such that the electromagnetic coils are arranged in relative proximity to a magnetometer of the mobile phone.

When a user presses one of the contact locations, the pressure applied by the user causes the piezoelectric material located at the contact location to experience mechanical strain which causes the piezoelectric material to produce a measurable electric charge. This electric charge is conveyed to the electromagnetic coil in electric communication with the piezoelectric material which causes the electromagnetic coil to generate a magnetic field. The magnetometer of the mobile phone can detect the magnetic field and identify properties of the magnetic field, including a strength of the magnetic field and a relative location of the electromagnetic coil generating the magnetic field. One or more processors of the mobile phone can receive a signal from the magnetometer indicating that the magnetic field generated by the electromagnetic coil has been detected. The mobile phone can then perform functions in response to detecting the electromagnetic field. In some implementations, the nature of the function performed by the mobile phone is determined at least in part based on the detected strength of the magnetic field and/or the detected relative location of the electromagnetic coil that produced the magnetic field.

Figure 1A:
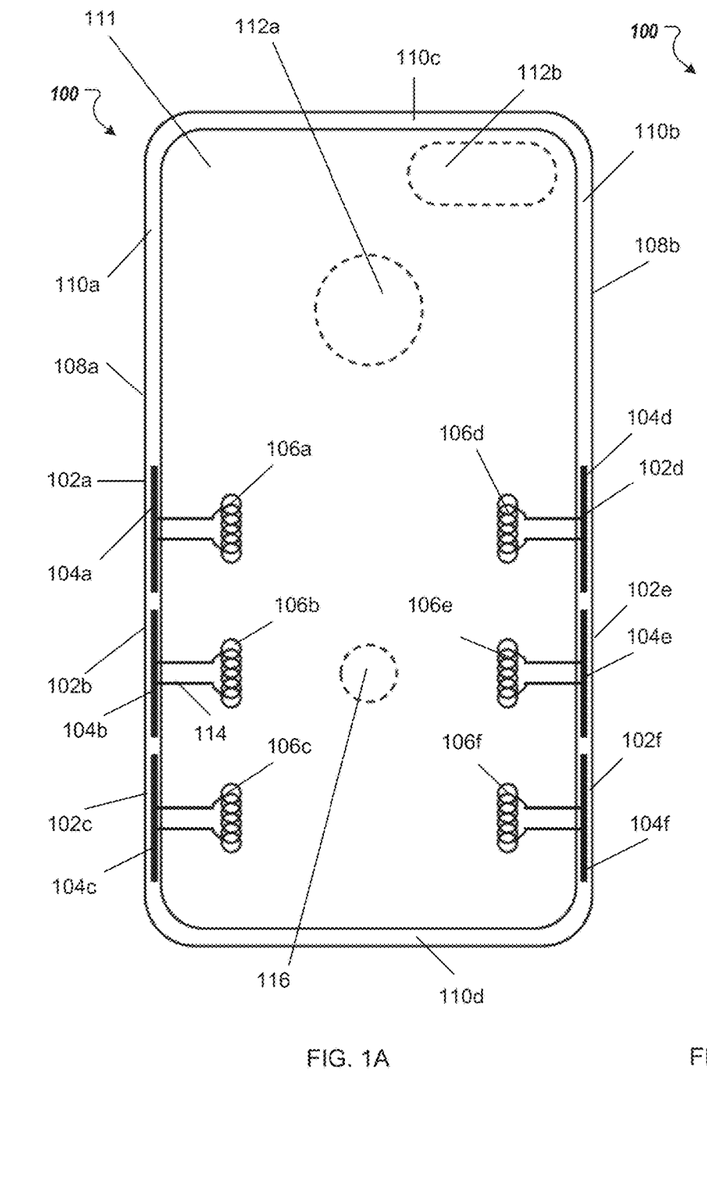
FIGS. 1A-1B show front and side views of an example mobile device case configured to wirelessly communicate with a mobile computing device.
Figure 1B:
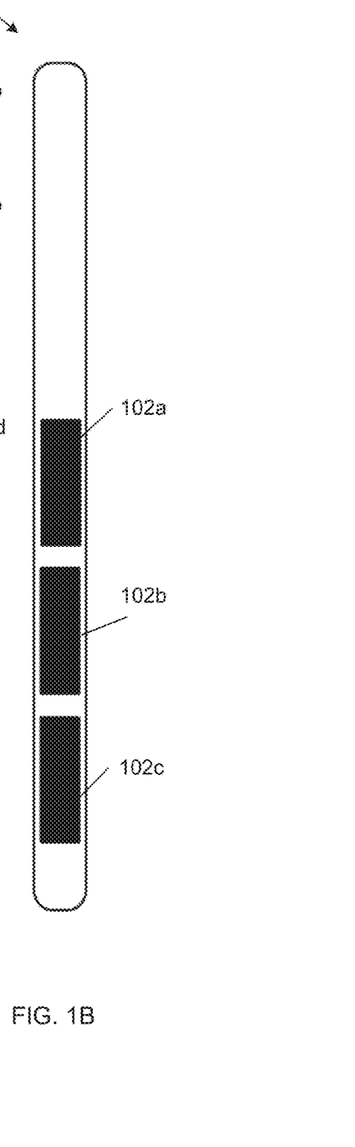

Referring now to FIGS. 1A-1B, a mobile device accessory 100 includes a number of contact locations 102$a$-$f$. Each of the contact locations 102$a$-$f$ includes a respective portion of piezoelectric material 104$a$-$f$. In the example shown, the piezoelectric material 104$a$-$f$ is positioned within the mobile device accessory 100. In some implementations, one or more of the portions of piezoelectric material 104$a$-$f$ can be positioned along one or more surfaces of the mobile device accessory 100. For example, piezoelectric material 104$a$ can be positioned on an outer surface 108$a$ of the mobile device accessory 100 rather than being positioned within a wall 110$a$ of the mobile device accessory 100 as shown in the example in FIG. 1A. In some implementations, the walls of the mobile device accessory 100 are made of an electrically inert material such that the portions of piezoelectric material 104$a$-$f$ are electrically isolated from one another. For example, a main body of the mobile device accessory 100 can be manufactured from an electrically non-conductive material such that the electrically non-conductive material prevents electrical interference between the various portions of piezoelectric material 104$a$-$f$. For example, a main body of the mobile device accessory 100 can be manufactured from a hardened or semi-hardened plastic and the portions of piezoelectric material 104$a$-$f$ can be embedded within the hardened or semi-hardened plastic such that the portions of piezoelectric material 104$a$-$f$ do not contact each other and are spaced apart far enough to minimize or eliminate possible unintended capacitance effects.

In the example depicted in FIGS. 1A-1B, the mobile device accessory 100 is a mobile device case designed to removably couple to a mobile computing device such as a mobile phone or a tablet device to protect the mobile computing device from damage due to, for example, accidental drops or collisions with other objects. The mobile device accessory 100 can leave all or a portion of a front face of the mobile phone exposed so that a user can view a display screen of the mobile phone and/or interact with touch screen functionality of the mobile phone. In some implementations, the mobile device accessory 100 takes other forms than that depicted in FIGS. 1A-1B. For example, the mobile device accessory 100 can be configured to attach to a mobile computing device without encompassing portions of the mobile computing device. For example, the mobile device accessory 100 can be a wallet attachment that attaches to a back surface of a mobile computing device for the purpose of storing money, ID, credit cards, and other small items. As another example, the mobile device accessory 100 can be part of a keychain that attaches to a mobile computing device. As another example, the mobile device accessory 100 can be a cover that does not encompass the mobile computing device but rather attaches to the mobile computing device to protect the screen of the mobile computing device. As another example, the mobile device accessory 100 can be a stand for a mobile computing device that supports the mobile computing device on a table or other surface. As yet another example, the mobile device accessory 100 can be a device for holding the mobile computing device away from the user, such as "selfie-stick" type devices that hold a mobile computing device at a distance from a user for the purpose of taking photos.

In some implementations, the mobile device accessory 100 can be an accessory that does not necessarily contact a mobile computing device. For example, the mobile device accessory 100 can be a remote controller for communicating with a mobile computing device.

Still referring to FIGS. 1A-1B, the piezoelectric material 104$a$-$f$ is embedded in walls 110$a$-$b$ of the mobile device accessory 100. The walls 110$a$-$b$ are configured to engage sides of a mobile computing device to secure the mobile device accessory 100 to the mobile computing device in a releasable fashion. In some embodiments, the mobile device accessory 100 further includes an upper wall 110$c$ and a lower wall 110$d$ for engaging upper and lower sides of the mobile computing device. In some implementations, the walls 110 are partially or wholly constructed of an electrically inert material. The mobile device accessory 100 can constructed in whole or in part of a semi-ridged material to protect the mobile computing device from damage due to accidental shock (such as from dropping the mobile computing device). In some implementations, the mobile device accessory 100 is constructed in whole or in part of a shock absorbing material to protect the mobile computing device from accidental shocks.

In the example shown in FIG. 1A, the mobile device accessory 100 includes a back plate 111 that includes cutaway portions 112$a$ and 112$b$. The cutaway portions 112$a$-$b$ can, for example, allow one or more cameras of a mobile computing device and/or a logo of the mobile computing device to be exposed. The back plate 111 can be configured to engage and protect a back surface of a mobile device.

The piezoelectric material 104$a$-$f$ can be composed of one or more materials, such as crystal or ceramic materials, that, produce a measurable electric charge as mechanical forces are exerted upon them. The portions of piezoelectric material 104$a$-$f$ that are included in the contact locations 102$a$-$f$ can be manufactured from one or more of the following materials: barium titanate, lead zierconate titanate (PZT), potassium niobate, sodium tungstate, Zinc oxide, sodium potassium niobate, bismuth ferrite, sodium niobate, bismuth titanate, sodium bismuth titanate, langasite, gallium orthophosphate, lithium niobate, lithium tantalate, and polyvinylidene fluoride.

In some embodiments, the piezoelectric material 104$a$-$f$ is configured such that the strength of the electric charge produced by the piezoelectric material 104$a$-$f$ increases proportionately with the mechanical stress imparted on the piezoelectric material 104*a-f*. For example, a user can apply pressure to the contact location 102*a* to impart mechanical stress on the piezoelectric material 104*a*. As the pressure imparted by the user increases, the voltage of the electric charge produced by the piezoelectric material 104*a* increases.

Still referring to FIGS. 1A-1B, the mobile device accessory 100 further includes electromagnetic coils 106*a-f*. Each of the electromagnetic coils 106*a-f* is electrically coupled to a respective one of the portions of piezoelectric material 104*a-f*. Each of the electromagnetic coils 106*a-f* is configured to generate a magnetic field in response to an electric current passing through the electromagnetic coils. For example, a user can apply pressure to the contact location 102*b* to cause the piezoelectric material 104*b* to produce an electric charge. The electric charge is conveyed to the electromagnetic coil 106*b* via wires 114. The electric charge causes an electric current to pass through the electromagnetic coil 106*b* which causes the electromagnetic coil 106*b* to produce a magnetic field.

In some implementations, the user can vary the amount of pressure applied to the contact location 102*b*. As the pressure exerted upon the contact location 102*b* varies, the mechanical stress imparted upon the piezoelectric material 104*b* correspondingly varies which in turn causes the strength of the electric charge generated by the piezoelectric material 104*b* to vary. These variations in the strength of the electric charge generated by the piezoelectric material 104*b* can cause the strength and reach/size of the magnetic field generated by the electromagnetic coil 106*b* to correspondingly vary.

In some implementations, different piezoelectric materials having different piezoelectric properties can be used for the different portions of piezoelectric material 104*a-f* such that certain of the portions of piezoelectric material 104*a-f* produce stronger electric charges (and correspondingly stronger/larger magnetic fields) than other portions of piezoelectric material 104*a-f*. In some implementations, one or more electronic components can be positioned along the electrical connection between one or more of the portions of piezoelectric material 104*a-f* and the corresponding electromagnetic coils 106*a-f*. For example, one or more electronic components can be inserted along the electrical connection between the piezoelectric material 104*b* and the electromagnetic coil 106*b*. The electric components can alter aspects of the electric charge produced by the piezoelectric material 104*b*, limit electric charge to a particular voltage range, or prevent electric charge that is below a minimum threshold level from reaching the electromagnetic coil 106*b*. Continuing with this example, one or more resistors, capacitors, diodes, signal amplifiers, or voltage limiters can be inserted along the electric path (depicted as wire 114) between piezoelectric material 104*b* and electromagnetic coil 106*b*.

The insertion of one or more electronic components between the portions of piezoelectric material 104*a-f* and the electromagnetic coils 106*a-f* can affect the magnetic fields produced by the electromagnetic coils 106*a-f*. For example, electronic components can be used to ensure that the electric signal passing through one of the electromagnetic coils 106*a-f* is strong enough to produce a magnetic field of a sufficient strength to be detected by a magnetometer of a mobile computing device associated with the mobile device accessory 100.

As another example, one or more electronic components can prevent electric charges caused by only slight mechanical stress imparted on one of the portions of piezoelectric material 104*a-f* from reaching the respective electromagnetic coil 106*a-f* while allowing stronger electric currents caused by a higher level of mechanical stress on the piezoelectric material 104 to reach the respective electromagnetic coil 106*a-f*. This functionality can allow the mobile device accessory 100 to avoid producing false signals caused by inadvertent contact with one of the contact locations 102*a-f*, while allowing deliberate contact with one of the contact locations 102*a-f* to cause one of the electromagnetic coils 106*a-f* to produce a magnetic field of sufficient strength to be detected by a magnetometer of a mobile computing device associated with the mobile device accessory 100. For example, the mobile device accessory 100 can be designed such that a threshold level of pressure must be applied to one of the contact locations 102*a-f* to cause sufficient mechanical stress on the corresponding portion of piezoelectric material 104*a-f* to produce a strong enough electric charge to cause the corresponding electromagnetic coil 106*a-f* to produce a measurable magnetic field.

Still referring to FIG. 1A, the indicator marked by reference numeral 116 is not intended to indicate an actual physical component of the mobile device accessory 100, but rather indicates a location in the vertical and horizontal directions of a magnetic detection component (such as a magnetometer) of a mobile device coupled to or positioned near the mobile device accessory 100. The position 116 is included in FIG. 1A to show the relative positioning of the electromagnetic coils 106*a-f*, portions of piezoelectric material 104*a-f*, and contact locations 102*a-f* with respect to the position of a magnetometer within a mobile computing device that the mobile device accessory 100 is configured to couple with and/or communicate with.

As shown in FIG. 1A, each of the electromagnetic coils 106*a-f* is positioned within a relative proximity of the position 116, with electromagnetic coils 106*b* and 106*e* positioned closest to the position 116 and the electromagnetic coils 106*a*, 106*c*, 106*d*, and 106*f* positioned substantially equidistantly from the position 116. In some implementations, each of the electromagnetic coils 106*a-f* is positioned within a maximum distance away from the position 116. In some implementations, the maximum distance is between three and five centimeters. In some implementations, the maximum distance is between three and four centimeters. In some implementations, the maximum distance is six centimeters. In some implementations, the maximum distance is five centimeters. In some implementations, the maximum distance is four centimeters.

In some implementations, each of the electromagnetic coils 106*a-f* is positioned a minimum distance away from the position 116 (e.g., to reduce interference between the electromagnetic coils 106*a-f*). In some implementations, the minimum distance is between 0.5 and three centimeters. In some implementations, the minimum distance is one centimeter. In some implementations the minimum distance is 1.5 centimeters. In some implementations, the minimum distance is two centimeters.

In some implementations, the minimum and/or maximum distance that the electromagnetic coils 106*a-f* are positioned away from the position 116 is determined based on an average magnetic field strength or magnetic field strength range of the magnetic fields produced by the electromagnetic coils 106*a-f* when the respective piezoelectric material 104*a-f* experiences mechanical stress. For example, the minimum and/or maximum distance that the electromagnetic coils 106*a-f* are positioned away from the position 116 can be determined based on the range of sizes of magnetic fields produced by the electromagnetic coils 106*a-f* due to pressure that is within a range of pressure that would typically be exerted by a user when pressing one of the contact locations 102a-f is exerted upon the contact locations 102a-f.

FIGS. 1A-1B show a particular example embodiment of the mobile device accessory 100. However, different mobile device accessories containing one or more contact locations including piezoelectric material that is in electric communication with a corresponding electromagnetic coil can be constructed to match various different mobile devices. For example, various different brands and models of mobile devices may have one or more magnetic sensing devices (e.g., one or more magnetometers) positioned at different positions within the mobile devices. The contact locations 102a-f, portions of piezoelectric material 104a-f, and electromagnetic coils 106a-f can be positioned in different locations within the mobile device accessory 100 to correspond to the different positions of magnetometers in different mobile devices. For example, the example shown in FIGS. 1A-1B shows a configuration of contact locations 102a-f, piezoelectric material 104a-f, and electromagnetic coils 106a-f designed to correspond to a first mobile computing device. The mobile device accessory 100 can be configured for a second mobile computing device having a magnetometer that is positioned higher in the vertical direction (for example, in the middle of the mobile computing device in the vertical direction). In this configuration, each of the contact locations 102a-f, portions of piezoelectric material 104a-f, and electromagnetic coils 106a-f can be positioned higher vertically within the mobile device accessory 100 to correspond to the different position of the magnetometer for the second mobile computing device.

In some implementations, when pressure above a threshold pressure is applied to each of the contact locations 102a-f, the magnetic fields produced by each of the electromagnetic coils 106a-f overlaps at the position 116. In some implementations, the minimum pressure that must be imparted on a particular contact location is different for each of the contact locations 102a-f. For example, the electromagnetic coils 106b and 106e are positioned closer to the position 116 than the other electromagnetic coils and therefore the threshold pressure that must be exerted on the contact locations 102b and 102e to cause the electromagnetic coils 106b and 106e to produce a magnetic fields that are detectable by a magnetometer of the corresponding mobile device may be less than the threshold pressure that must be applied to each of the contact locations 102a, 102c, 102d, and 102f to cause the corresponding electromagnetic coils 106a, 106c, 106d, and 106f to produce magnetic fields that are detectable by a magnetometer of the corresponding mobile device.

Due to the different positioning of the electromagnetic coils 106a-f with respect to the position 116, the magnetometer of the mobile device associated with the mobile device accessory 100 (which is positioned in the vertical and horizontal directions at the position 116) can identify which of the electromagnetic coils 106a-f is producing a magnetic field based on determining the direction of the source of the detected magnetic field with respect to the position 116. For example, the magnetic waves detected by the magnetometer can allow the mobile device to determine both the strength and direction of the magnetic field.

Figure 2:
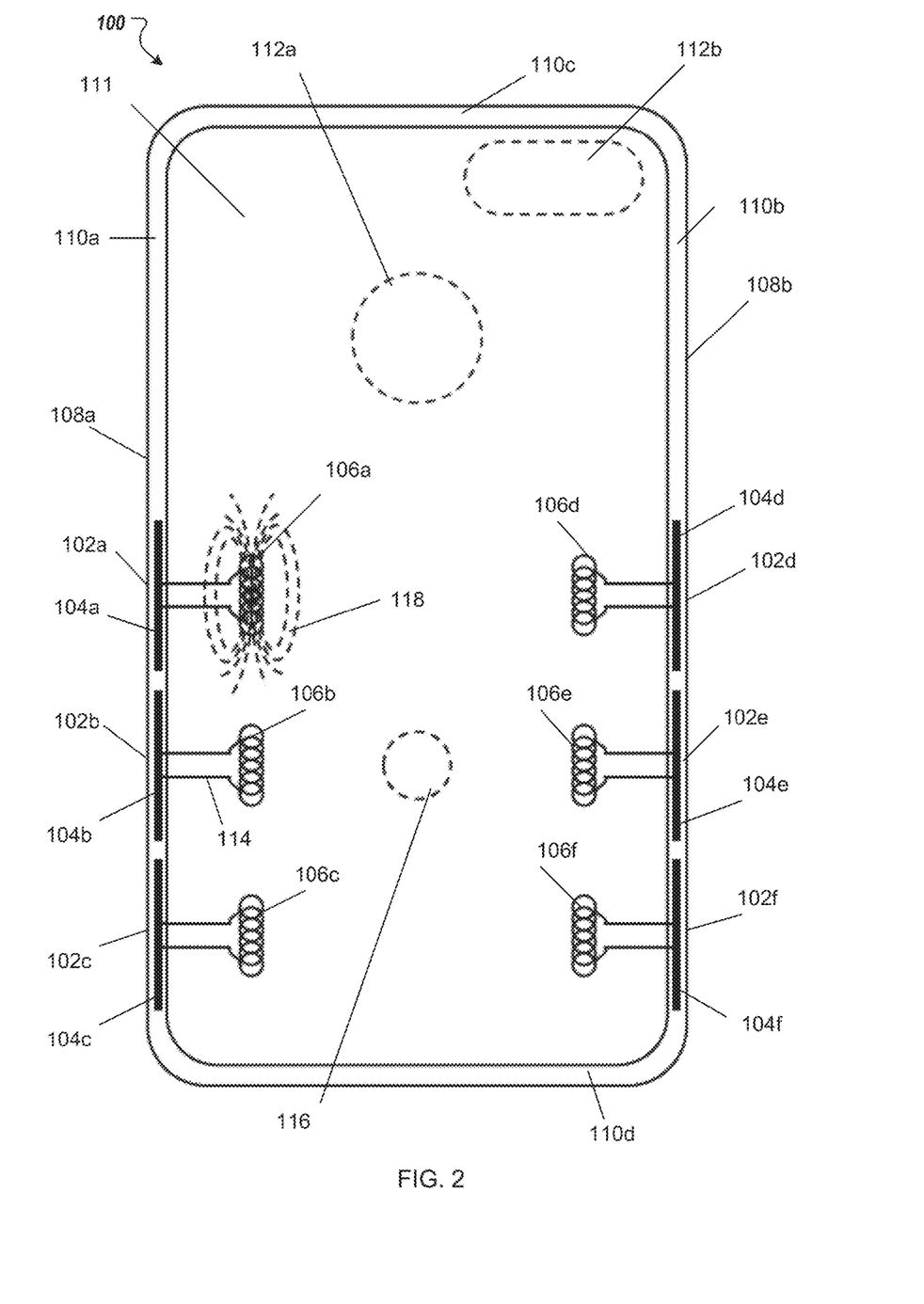
FIG. 2 shows the example mobile device case of FIG. 1 with one of the contact locations in an activated state.

For example, turning to FIG. 2, the mobile device accessory 100 is shown with one of the contact locations 102a-f in an activated state. Specifically, FIG. 2 shows the mobile device accessory 100 with the contact location 102a in an activated state, for example, due to a user applying pressure to the contact location 102a. When the user applies pressure to the contact location 102a, this imparts mechanical stress upon the portion of piezoelectric material 104a which in turn causes the piezoelectric material 104a to produce an electric charge. The electric charge is communicated as an electric current via an electrical connection to the electromagnetic coil 106a which causes the electromagnetic coil 106a to produce a magnetic field 118. In some embodiments, the mobile device accessory 100 is configured such that the user must impart a force upon the contact location 102a that exceeds a minimum threshold to cause the electromagnetic coil 106a to produce the magnetic field 118 such that the magnetic field 118 is of sufficient strength/size that it can be readily detected by a magnetometer of an associated mobile device positioned (in the vertical and horizontal directions) at the position 116.

The magnetometer of the mobile device associated with the mobile device accessory 100 can determine a direction of the source of the magnetic field 118 with respect to the position 116. In the example depicted in FIG. 2, the source of the magnetic field 118 is electromagnetic coil 106a. Based on the magnetic field 118, the magnetometer can determine that the electromagnetic coil 106a is positioned in an upper left direction of the position 116. One or more processors of the mobile device can use this detected direction to determine that a user has pressed the contact location 102a. Similarly, if a user applies pressure to the contact location 102e with sufficient pressure to cause the piezoelectric material 104e to produce a strong enough electric signal to cause the electromagnetic coil 106e to produce a magnetic field that can be detected by the magnetometer, the magnetometer can determine that the source of the magnetic field produced by the electromagnetic coil 106e is due right of the position 116. One or more processors of the mobile device can use this termination of the direction of the source of the magnetic field produced by the electromagnetic coil 106e to determine that a user has pressed the contact location 102e.

In some implementations, a user can press multiple contact locations at the same time. For example, the user can press the contact location 102a to cause the electromagnetic coil 106a to produce the magnetic field 118. While pressing the contact location 102a, the user also presses the contact location 102b, applying mechanical stress to the portion of piezoelectric material 104b, which causes electromagnetic coil 106b to produce its own magnetic field. The magnetic fields produced by the electromagnetic coils 106a-b will overlap to create a single distorted magnetic field in some areas. The overlapping of the magnetic fields creates an interference pattern that can be detected by the magnetometer. The magnetometer can detect the combine magnetic field produced by the electromagnetic coils 106a-b and determine that the direction indicated by the combined magnetic field lies between the locations of the electromagnetic coils 106a-b. One or more processors of the mobile device can use this direction determination to determine that the user is pressing both the contact location 102a and the contact location 102b.

In some implementations, the magnetometer of the associated mobile device can detect a strength of the magnetic field 118. One or more processors of the associated mobile computing device can use the detected strength of the magnetic field 118 to determine a relative amount of force exerted on the contact location 102a by the user. In some implementations, the processors can cause the mobile computing device to perform different actions in response to different amounts of force exerted upon the contact location 102a. For example, when the user applies a first amount of pressure in a first range of pressures to the contact location 102a, the electromagnetic coil 106a will produce the magnetic field 118 such that the magnetic field 118 has a strength within a first range. The associated mobile computing device can determine that the strength of the magnetic field 118 is within a first range and perform a first function in response to the determination. The user can then apply a second amount of pressure to the contact location 102a that is in a second range of pressures that is greater than the first range of pressures. This can cause the electromagnetic coil 106a to produce the magnetic field 118 such that the magnetic field 118 has a strength within a second range. The associated mobile computing device can determine that the strength of the magnetic field 118 is within a second range and perform a second, different function in response to the determination.

In some implementations, the magnitude of the magnetic field 118 (which is controlled by the amount of pressure applied to the contact location 102a) is determined by the associated mobile computing device and is used to control functions of the mobile computing device. For example, the mobile computing device can associate a detection of the contact location 102a being pressed with a function for increasing volume of the mobile computing device. As the detected magnitude of the magnetic field 118 increases, the mobile computing device can increase the rate at which the volume is increased (e.g., by increasing two volume bars with each hard press rather than just one volume bar for a weaker press). As another example, the mobile computing device can associate a detection of the contact location 102a being pressed with an acceleration function in a driving video game. As the detected magnitude of the magnetic field 118 increases, the mobile computing device can increase the rate of acceleration of a vehicle in the driving video game.

Figure 3:
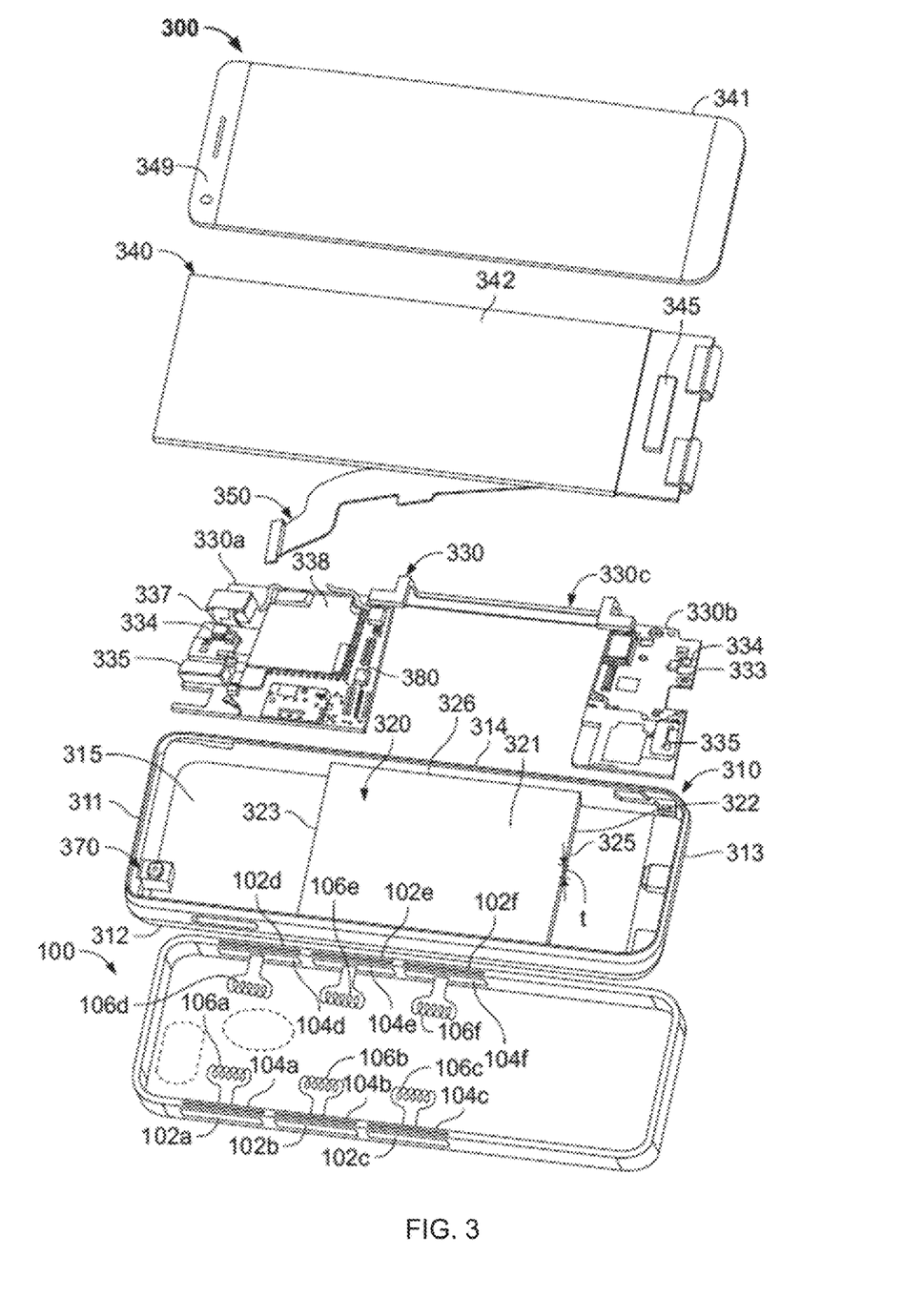
FIG. 3 shows a perspective exploded view of an example electronic device having a magnetometer in relation to a case.

Referring to FIG. 3, mobile device accessory 100 is shown with respect to an example electronic device 300. The electronic device 300 includes an electronic device housing 310, battery 320, circuit board 330, display assembly 340, camera module 370, and magnetometer 380. The magnetometer 380 is configured to sense magnetic fields, including the strength and direction of magnetic fields. The magnetometer 380 can, for example, sense the Earth's magnetic field to allow the electronic device to provide compass functionality for use with navigation applications and other applications that can benefit from determining an orientation of the electronic device 300. Additionally, the magnetometer 380 can sense magnetic field produced by devices positioned near the electronic device 300, such as magnetic fields produced by the mobile device accessory 100 as described above.

Electronic device 300 may be an electronic device including a magnetometer, such as a mobile phone, music player, tablet, laptop computing device, wearable electronic device, data storage device, display device, adapter device, desktop computer, digital camera, or other electronic device.

Electronic device housing 310 may be a bucket-type enclosure having first, second, third, and fourth side portions 311, 312, 313, 314 that define outer sidewalls of electronic device 300, and a back major planar face 315 integrally formed with side portions 311, 312, 313, 314. A bucket-type enclosure allows components of electronic device 300 to be accommodated within housing 310 and enclosed by an outer cover, such as outer cover 341. In other embodiments, one or more side portions 311, 312, 313, 314, and/or back major planar face 315 may be formed separately and subsequently joined together (e.g., with one or more adhesives, welds, snap-fit connectors, fasteners, etc.) to form electronic device housing 310. In various embodiments, electronic device housing 310 may be an H-beam type housing or other electronic device housing 310 that includes one or more walls that provide a housing to at least partially support and/or enclose components of electronic device 300.

Electronic device housing 310 is made from a material that provides adequate structural rigidity to support and protect internal components of electronic device 300. In some embodiments, electronic device housing 310 is formed from a single piece of metal. Electronic device housing 310 may be milled, molded, forged, etched, printed, or otherwise formed. Alternatively or additionally, electronic device housing 310 may be formed from plastic, glass, wood, carbon fiber, ceramic, combinations thereof, and/or other materials.

Electronic device housing 310 and an outer cover 341 define an interior volume that can house various components of electronic device 310, including battery 320, circuit board 330, display assembly 340, and camera module 370. Electronic device housing 310 can accommodate additional components of electronic device 300, such as microphone 333, speaker 334, sensors 335, such as fingerprint sensors, proximity sensors, accelerometers, and/or other sensors, flash devices 337, processor 338, magnetometer 380, antennas, and/or other components. In various embodiments, some or all of these components may be electrically connected with circuit board 330.

Display assembly 340 provides a user interface display that displays information to a user. For example, display assembly 340 may provide a touch screen display that a user can interact with to view displayed information and to provide input to electronic device 300. In some embodiments, display assembly 340 occupies substantially all or the majority of a front major face 316 of electronic device 300 (e.g., and covers battery 320 and first, second, and third circuit boards 330a, 330b, 330c), and includes a rectangular visible display.

Display assembly 340 includes one or more substrate layers that provide the visible display and/or allow display assembly 340 to receive touch input from a user. For example, outer cover 341 may serve as an outermost layer that encloses other components of display assembly 340 and electronic device 300 and that a user may physically touch to provide input to electronic device 300. In some embodiments, display assembly 340 includes a liquid crystal display (LCD) panel 342 including a liquid crystal material positioned between one or more color filter and thin-film-transistor (TFT) layers. The layers of display panel 342 may include substrates formed from glass or polymer, such as polyamide. In various embodiments, display assembly 340 may be a light-emitting diode (LED) display, an organic light-emitting diode (OLED) display, such as an active-matrix organic light-emitting diode (AMOLED) display, a plasma display, an electronic ink display, or other display that provides visual output to a user.

Display assembly 340 includes driver circuitry used to control display output and/or receive user input. In some embodiments, driver circuitry includes a display integrated circuit 345 that is mounted in electrical communication with the TFT layers of display panel 342, for example by gate lines or other electrical connection. Display integrated circuit 345 may receive display data from processor 338, for example, and deliver corresponding signals to control the optical properties of a liquid crystal layer, for example, to produce a visible output.

Connection between display integrated circuit 345 and circuit board 330 (and processor 338, for example) may be provided by an electrical conductor that facilitates a robust electrical connection while maintaining a low profile configuration that does not significantly increase the overall dimensions of electronic device 300. In some embodiments, a flex conductor 350 connects display integrated circuit 345 and circuit board 330. Flex conductor 350 includes conductive structures on a thin, flexible substrate. Flex conductor 350 has a relatively thin profile and may be bent along a longitudinal direction to fit between various components of electronic device 300, such as to connect from a front face of a display substrate to circuit board 330 by passing between battery 320 and a rear of display assembly 340. Flex conductor 350 may be connected between first circuit board 330a (e.g., a top circuit board) or second circuit board 330b (e.g., a bottom circuit board). Alternatively or additionally, further electrical communication between display assembly 340 and the other of first circuit board 330a or second circuit board 330b is provided via third circuit board 330c.

Components of display assembly 340 and flex conductor 350 may be positioned within electronic device 300 such that the space required to connect display assembly 340 with circuit board 330 is reduced. In some embodiments, display integrated circuit 345 may be positioned at a bottom of display substrate 342 (e.g., a portion of display substrate 342 close to bottom wall 313) and flex conductor 350 wraps around a back side of display substrate 342 to connect with first and/or second circuit boards 330a, 330b. In some embodiments, display integrated circuit 345 may be positioned at a top of display substrate 342 (e.g., a portion of display substrate 342 close to top wall 311) and flex conductor 350 wraps around a back side of display substrate 342 to connect with first and/or second circuit boards 330a, 330b. In some embodiments, display integrated circuit 345 may be positioned along a side of display substrate 342 (e.g., a side portion of display substrate 342 close to sidewall 312 or sidewall 314) and flex conductor wraps around a back side of display substrate 342 to connect with first and/or second circuit boards 3301, 330b. In some embodiments, display integrated circuit 345 and flex conductor 350 are positioned so that flex conductor 350 does not extend between display assembly 340 and battery 320. Positioning the battery 320 directly adjacent display assembly 340 (e.g., without an intervening electrical conductor 350 passing between battery 320 and display assembly 340) facilitates an increased battery size having a greater power capacity.

Conductive structures of flex conductor 350 may include conductive lines, printed conductive traces, or other conductive components that provide electrical connection between respective electrical contacts associated with display integrated circuit 345 and circuit board 330. Flex conductor 350 may be a single, double, or multi-layer flexible printed circuit including a polyamide, PEEK, polyester, having printed or laminated conductive elements, for example. Such construction provides robust electrical characteristics that can provide reliable connection between various components while having a low bending radius to facilitate compact arrangement of flex conductor 350 within electronic device 300.

Battery 320 is positioned within electronic device housing 310. In some embodiments, battery 320 is positioned substantially centrally and/or towards a bottom region of electronic device housing 310 that may promote a user's perception of stability when electronic device 300 is handled. For example, battery 320 may be positioned adjacent to first, second, and/or third circuit boards 330a, 330b, 330c such that battery 320 is positioned substantially centrally between top and bottom sidewalls 311, 313. In other embodiments, battery 320 may be positioned in a stacked configuration such that circuit boards 330a and/or 330b are between battery 320 and display assembly 340 (e.g., sandwiched between battery 320 and display assembly 340), or vice versa.

Battery 320 provides a primary source of power for electronic device 300 and its components. Battery 320 may include a secondary cell, rechargeable battery configured for use through thousands of battery charging cycles over the entire useful life of electronic device 300, for example. In various embodiments, battery 320 may be a lithium polymer battery, lithium ion battery, nickel metal hydride battery, nickel cadmium battery, or other battery type configured to power electronic device 300 over many charging cycles. Alternatively or additionally, battery 320 may include a primary cell battery configured to be replaced when substantially discharged.

Battery 320 is shaped to provide a desired power capacity in a space-efficient configuration. In some embodiments, battery 320 has front and back major planar faces 321, 322 separated by minor sides 323, 324, 325, 326 defining a thickness ($t_{thickness}$) of battery 320. For example, sides 323, 325, may be parallel with top and bottom sidewalls 311, 313 of electronic device housing 310, and extend substantially across a width of electronic device housing 310, such as more than 50%, more than 75%, or more than 90% of the width of electronic device housing. Such a configuration promotes a relatively high power capacity for a battery having a particular power density.

Circuit board 330 is configured to accommodate components of electronic device 300 in a space-efficient manner, and provide robust mechanical and electrical connections between these components. Circuit board 330 may support and/or electrically connect one or more components of electronic device 300 such as one or more of battery 320, display 340, camera module 370, magnetometer 380, microphone 333, speaker 334, sensors 335, flash devices 337, processor 338, electrical connectors (e.g., USB connectors, audio connectors, etc.), antenna lines, and/or other components. In some embodiments, circuit board 330 includes first circuit board 330a positioned at a top region of electronic device housing 310, second circuit board 330b positioned at a bottom region of electronic device housing 310. Third circuit board 330c connects the first and second circuit boards 330a, 330b. First, second, and third, circuit boards 330a, 330b may be separately formed circuit boards and may be electrically connected by an electrical conductor. In other embodiments, first and second circuit boards 330a, 330b are integrally formed as a unitary circuit board with third circuit board 330c extending between first and second circuit boards 330a, 330b. First, second, and/or third circuit boards 330a, 330b, 330c may be printed circuit boards, flexible circuit boards, other circuit board types, and/or combinations thereof.

First and second circuit boards 330a, 330b may be positioned at top and bottom positions of electronic device housing 310 so that various components may be accommodated at top and bottom regions of the electronic device. For example, first circuit board 330a is positioned at a top region of electronic device housing 310 and may include components beneficially positioned at the top region. First circuit board 330a may accommodate components such as magnetometer 380, camera module 370, an earpiece assembly including a speaker, proximity sensor, antenna lines, a microphone configured to receive audio from the external environment that may be processed to provide noise cancellation, camera flash, diversity antenna, and/or other components. Second circuit board 330 is positioned at a bottom region of electronic device housing 310 and may include components beneficially positioned at the bottom region. Second circuit board may accommodate components such as an electrical connector (e.g., USB connectors, audio connectors, etc.), audio speaker, microphone to receive audio input from a user or the external environment, vibrator, and/or other components. Such positioning may promote functionality and usability of the components by a user of electronic device 300.

Third circuit board 330c may accommodate one or more other electrical components and/or electrically connect various components of first and second boards 330a, 330b. In some embodiments, third circuit board 330c includes one or more of a hall effects sensor, battery thermistor, or other electronic components. Third circuit board 330c may electrically connect processor 338, on first circuit board 330a, for example, with the components of second circuit board 330b. In some embodiments, circuit board 330c provides the only electrical connection between first and second circuit boards 330a, 330b. Electronic device 300 may not include a flex conductor, for example, extending over battery 320 between first and second circuit boards 330a, 330b, and may not include a flex conductor extending over battery 320 (e.g., between battery 320 and display assembly 340) at all.

The mobile device accessory 100 is configured to engage the first, second, third, and fourth side portions 311, 312, 313, 314 that define outer sidewalls of electronic device 300, and the back major planar face 315 integrally formed with side portions 311, 312, 313, 314. For example, side wall 110a is configured to engage side portion 312, side wall 110b is configured to engage side portion 314, upper wall 110c is configured to engage side portion 311, and lower wall 110d is configured to engage side portion 314 while the back plate 111 is configured to engage the back major planar face 315. In some implementations, the mobile device accessory 100 engages some but not all of the first, second, third, and fourth side portions 311, 312, 313, 314 and the back major planar face 315.

As described above, the mobile device accessory 100 includes the contact locations 102a-f having the portions of piezoelectric material 104a-f embedded within the side walls 110a and 110b. The portions of piezoelectric material 104a-f are in electrical communication with the electromagnetic coils 106a-f such that when pressure is imparted upon one of the contact locations 102a-f, the corresponding one of the electromagnetic coils 106a-f produces a magnetic field that can be detected by the magnetometer 380.

The processor 338 is in electrical communication with the magnetometer 380 through the circuit board 330a. The processor 338 can use signals received from the magnetometer 380 to determine which of the contact locations 102a-f are being pressed by a user and an intensity of the pressure applied to the contact locations 102a-f being pressed by the user. For example, when a user presses the contact location 102a, the piezoelectric material 104a experiences mechanical stress which causes the piezoelectric material 104a produce an electric charge. The electric charge generated by the piezoelectric material 104a causes an electric current to pass through the electromagnetic coil 106a causing the magnetic coil 106a to produce a magnetic field that can be detected by the magnetometer 380. In addition to detecting the presence of the magnetic field, the magnetometer 380 can also determine a direction of the source of the magnetic field. In this example, the source of the magnetic field is electromagnetic coil 106a. The magnetometer 380 can determine the relative direction of the electromagnetic coil 106a with respect to the magnetometer 380 based on the detected magnetic field produced by the electromagnetic coil 106a.

The processor 338 can interpret the magnetic fields detected by the magnetometer 380 to identify when one or more of the contact locations 102a-f is being pressed by a user and which of the contact locations 102a-f is being pressed by the user. For example, signals received from the magnetometer 380 can indicate that a magnetic field originating at the electromagnetic coil 106b has been detected. Based on the direction indicated by the detected magnetic field, the processor 338 can determine that a user is pressing the contact location 102b.

The processor 338 can cause the electronic device 300 to perform functions in response to detection of one or more of the contact locations 102a-f being pressed. For example, the processor 338 can control functions of the camera module 370, microphone 333, speaker 334, or display assembly 340 in response to detection of a magnetic field produced by one of the electromagnetic coils 106a-f in response to a user pressing one of the contact locations 102a-f. For example, when a camera application is being executed by the electronic device 300, detection of a selection of contact location 102a can cause the electronic device 300 to take a picture using the camera module 370, while detection of selection of the contact location 102b can cause the electronic device 300 switch between forward and reward facing cameras of the camera module 370.

Continuing with this example, detection of selection of the contact location 120d can initiate a zoom-in function while detection of selection of the contact location 120e can initiate a zoom-out function. In this example, the magnetometer 380 can detect the strength of magnetic fields produced by the electromagnetic coils 106a-f which can in turn be used by the processor 338 to determine how functions are to be performed. For example, the strength of an electromagnetic field generated by the electromagnetic coil 106d can control the rate at which the zoom-in function of the camera application zooms-in. For example, as the amount of pressure exerted by a user on the contact location 102d increases, the amount of physical stress on the portion of piezoelectric material 104d increases, which corresponding causes the strength of the magnetic field produced by the electromagnetic coil 106d to increase. The magnetometer 380 can sense this increase in pressure and the processor 338 can cause the rate of zooming of the zoom-in function of the camera application to correspondingly increase with the increased pressure exerted by the user.

Display functionality, sound functionality, and other functionality of the electronic device 300 can similarly be controlled based on detected user selection of the contact locations 102a-f. For example, detection of user selection of the contact locations 102a-f (based on the magnetometer 380 detecting magnetic fields generated by the electromagnetic coils 106a-f) can be used to select menu options, control display functions, and control functions within applications executing on the electronic device 300.

Figure 4:
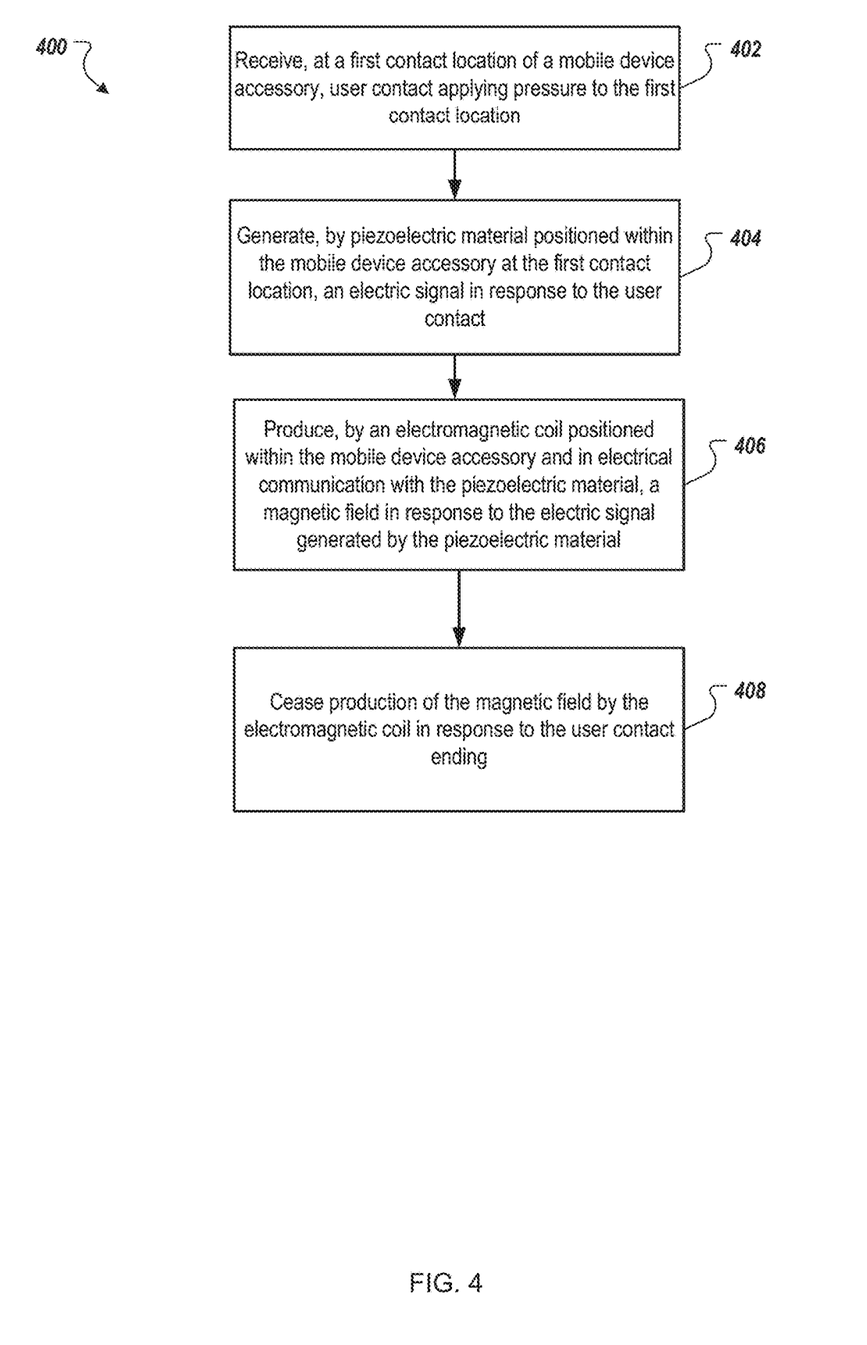
FIG. 4 is a flow chart of an example process for transmitting a communication from an unpowered mobile device accessory to a mobile computing device.

FIG. 4 is a flow chart of an example process 400 for communicating from an unpowered mobile device accessory to a mobile device. The process 400 can be performed, for example, by the mobile device accessory 100 of FIG. 1A.

User contact applying pressure to a first contact location of a mobile device accessory is received (402). For example, referring to FIG. 1, a user can apply pressure to the outer surface 108b of the side wall 110b of mobile device accessory 100 at contact location 102d. The contact location 102d receives the physical pressure applied by the user.

A piezoelectric material positioned within the mobile device accessory at the first contact location generates an electric signal in response to the user contact (404). For example, as the user applies pressure to the contact location 102*d* the portion of piezoelectric material 104*d* experiences mechanical stress due to the pressure exerted by the user. The mechanical stress on the piezoelectric material 104*d* causes the piezoelectric material 104*d* to generate a measurable electric charge.

A magnetic field is produced by an electromagnetic coil positioned within the mobile device accessory and that is in electrical communication with the piezoelectric material in response to the electric signal generated by the piezoelectric material (406). For example, the piezoelectric material 104*d* is in electrical communication with the electromagnetic coil 106*d*. When the piezoelectric material 104*d* produces an electric charge in response to the pressure applied by the user to contact location 102*d*, the electric charge is communicated to the electromagnetic coil 106*d* as an electric current that passes through the electromagnetic coil 106*d*, causing the electromagnetic coil 106*d* to produce a magnetic field. In some implementations, one or more electronic components is inserted along the electricity flow path between the electromagnetic coil 106*d* and the piezoelectric material 104*d*. For example, a diode can be inserted along the electricity flow path such that electric current produced by the piezoelectric material 104*d* is only permitted to flow in a single direction through the electromagnetic coil 106*d*.

The electromagnetic coil ceases production of the magnetic field in response to the user contact ending (408). For example, when the user removes pressure from the contact location 102*d*, this relieves the mechanical stress imparted on the piezoelectric material 104*d* which causes the piezoelectric material 104*d* to stop producing a measurable electrical current. The electric current that had been passing through the electromagnetic coil 106*d* therefore stops which causes the electromagnetic coil 106*d* to stop producing a magnetic field.

Figure 5:
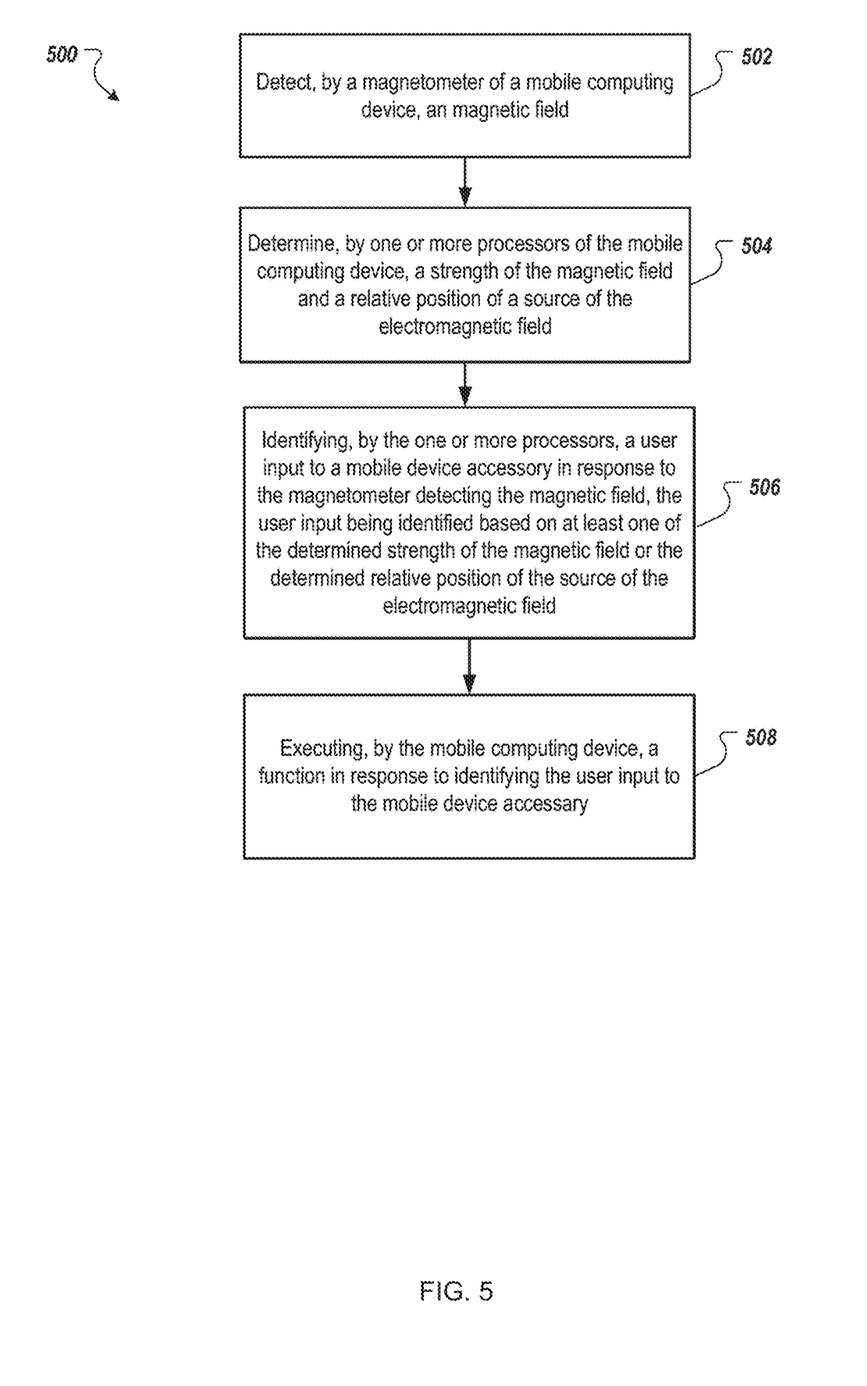
FIG. 5 is a flow chart of an example process for identifying a communication from a mobile computing device accessory.

FIG. 5 is a flow chart of an example process 500 for identifying a magnetic field produced by a mobile device accessory and responding to the detection of the magnetic field. The process 500 can be performed by one or more data processing apparatus, such as the electronic device 300 of FIG. 3. Operations of the process 500 can be implemented by instructions stored on a non-transitory computer readable medium, where execution of the instructions causes one or more data processing apparatus to perform operations of the process 500.

A magnetic field is detected by a magnetometer of a mobile computing device (502). For example, the magnetometer 380 of the electronic device 300 depicted in FIG. 3 can detect a magnetic field. The magnetic field can, for example, be produced by one of the electromagnetic coils 106*a-f* of the mobile device accessory 100 that is engaged with the electronic device 300 in response to a user selecting one of the contact locations 102*a-f* to impart stress on a corresponding portion of piezoelectric material 104*a-f*.

A strength of the magnetic field and a relative position of a source of the electromagnetic field is determined by one or more processors of the mobile computing device (504). For example, the processor 338 of the electronic device 300 can receive signals from the magnetometer 380. The processor 338 can use the received signals to determine that the magnetometer 380 has detected the magnetic field. The processor 338 can further use the received signals to determine a strength and relative position of the source of the magnetic field. Determining the relative position can include, for example, determining a direction of a source of the magnetic field with respect to the magnetometer 380. For example, the processor 338 can determine that the source of the magnetic field is the electromagnetic coil 106*d* in response to determining that the direction of the source of the magnetic field with respect to the magnetometer 380 is in the direction of the electromagnetic coil 106*d*.

A user input to a mobile device accessory is identified by the one or more processors in response to the magnetometer detecting the magnetic field, the user input being identified based on at least one of the determined strength of the magnetic field or the determined relative position of the source of the electromagnetic field (506). For example, the processor 338 can determine that the direction of the detected magnetic field is in the direction of the electromagnetic coil 106*d*. Based on this determination, the processor 338 can determine that a user has selected the contact location 102*d*. Similarly, the processor 338 can determine that a second magnetic field detected by the magnetometer 380 is produced by a source in a direction that is the same direction as electromagnetic coil 106*f*. In response to this determination, the processor 338 can determine that the user has selected contact location 102*f*.

A function is executed by the mobile computing device in response to identifying the user input to the mobile device accessory (508). For example, the processor 338 can use the detection of the user selection of contact location 102*a* to control selection of a menu option, to change a display or audio parameter, to execute a function (e.g., such as taking a picture, starting or ending a video, starting or ending a phone call, or sending a text or image communication), or to perform other functions. For example, the processor 338 can determine that a particular combination of the contact locations 102*a-f* are being pressed simultaneously by the user or that a number of contact locations 102*a-f* have been selected by the user in a particular sequence and use this determination to unlock the electronic device 300 from a locked state.

Alternative Embodiments

While particular embodiments have been described with respect to the figures, other embodiments are contemplated. For example, other embodiments of mobile device accessories have more or less contact locations and corresponding portions of piezoelectric material and electromagnetic coils than the example mobile device accessory 100 depicted in FIGS. 1A-1B. For example, a mobile device accessory can include two contact locations along a first wall and a single contact location along a second wall. As another example, a mobile device accessory can have a single contact location having a single portion of piezoelectric material in electrical communication with a single electromagnetic coil. As another example, a large portion of a mobile device accessory can comprise piezoelectric material such that pressure exerted upon any portion, or most portions of the mobile device accessory causes the piezoelectric material to produce an electric current which is communicated to an electromagnetic coil to produce a magnetic field. Such a configuration can be used, for example, to detect contact user with a mobile device accessory without detecting a particular location of the user contact.

In some embodiments, the electric current produced by portions of piezoelectric material of a mobile device accessory can be communicated to other electric components other than electromagnetic coils. For example, a number of Electrocomponents that vibrate when exposed to electric current can be positioned within a mobile device accessory in electric communication with respective portions of piezoelectric material. A mobile device associated with the mobile device accessory can detect the vibrations and perform functions in response to the sensed vibrations.

As another example, electric components that generate sound or light can be incorporated into a mobile device accessory and placed in electrical communication with one or more portions of piezoelectric material. The sounds and/or light generated by these electric components can be detected by an associated computing device and the computing device can perform functions in response to detecting the sounds and/or light.

In some embodiments, one or more piezotransductive materials other than piezoelectric material can be incorporated into a mobile device accessory for the purpose of enabling communication from the mobile device accessory to an associated mobile device. For example, piezomagnetic material (such as antiferromagnetic crystals) can be included as part of a mobile device accessory at one or more contact locations. The piezomagnetic material can produce a magnetic field when mechanical stress is applied to the piezomagnetic material. The magnetic fields produced by the piezomagnetic material can be sensed by a magnetometer of an associated mobile device. The associated mobile device can perform functions in response to detection of the magnetic fields produced by the piezomagnetic material.

As another example, piezoluminescent material can be incorporated as part of a mobile device accessory at one or more contact locations in place of the above described piezoelectric material. The piezoluminescent material can emit light in response to mechanical stress due to pressure exerted at a corresponding contact location. A mobile device associated with the mobile device accessory can detect the light emitted by the piezoluminescent material and perform functions in response to detecting the light emitted by the piezoluminescent material.

Although a few implementations have been described in detail above, other modifications are possible. Moreover, other mechanisms for performing the systems and methods described in this document may be used. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. A mobile device case comprising:
   an inner surface configured to detachably engage an outer surface of a mobile computing device housing;
   first and second opposing side walls for engaging respective edges of the mobile computing device housing;
   a first plurality of contact locations positioned along the first side wall, each of the first plurality of contact locations including piezoelectric material configured to produce a first electric current in response to application of mechanical stress, the first electric current produced without an external power source;
   a second plurality of contact locations positioned along the second side wall, each of the second plurality of contact locations including piezoelectric material configured to produce a second electric current in response to application of mechanical stress, the second electric current produced without an external power source; and
   a plurality of electromagnetic coils, each of the plurality of electromagnetic coils in electric communication with the piezoelectric material of a distinct one of the first plurality of contact locations or the second plurality of contact locations, each respective electromagnetic coil of the plurality of electromagnetic coils configured to produce a respective magnetic field in response to receiving the respective electric current produced by the respective piezoelectric material in contact with the respective electromagnetic coil.

2. The mobile device case of claim 1, wherein the first plurality of contact locations comprises three or more contact locations positioned along the first side wall and the second plurality of contact locations comprises three or more contact locations positioned along the second side wall, wherein the first plurality of contact locations are substantially equidistantly spaced and the second plurality of contact locations are substantially equidistantly spaced.

3. The mobile device case of claim 1, wherein the piezoelectric material is configured to produce electric charge that increases in voltage as the mechanical stress placed upon the piezoelectric material increases.

4. The mobile device case of claim 1, wherein the magnetic fields produced by each of the plurality of electromagnetic coils overlap at a particular location when each of the contact locations receives pressure that surpasses a threshold pressure value.

5. A mobile device accessory comprising:
   a first inner surface for detachably engaging an outer surface of a mobile computing device housing;
   a first piece of piezoelectric material positioned at least partially within the mobile device accessory such that when user input applies pressure to a first outer surface opposite the first inner surface, the first piece of piezoelectric material experiences first mechanical stress and produces a first electric current in response to the first mechanical stress, the first electric current produced without an external power source; and
   a first electromagnetic coil that is in electric communication with the first piece of piezoelectric material and that is configured to produce a magnetic field in response to the first electric current produced by the first piece of piezoelectric material;
   a second piece of piezoelectric material positioned at least partially within the mobile device accessory such that when user input applies pressure to the mobile device accessory at a location near the second piece of piezoelectric material, the second piece of piezoelectric material experiences second mechanical stress and produces a second electric current in response to the second mechanical stress, the second electric current produced without an external power source; and
   a second electromagnetic coil that is in electric communication with the second piece of piezoelectric material and that is configured to produce a magnetic field in response to the second electric current produced by the second piece of piezoelectric material.

6. The mobile device accessory of claim 5, wherein the first piece of piezoelectric material is configured to produce first electric current that increases in voltage as the first mechanical stress placed upon the piezoelectric material increases.

7. The mobile device accessory of claim 5, wherein the mobile device accessory is a case for the mobile computing device.

8. The mobile device accessory of claim 5,
wherein the first piece of piezoelectric material and the second piece of piezoelectric material are positioned equidistantly from a reference location.

9. The mobile device accessory of claim 8, wherein the reference location represents the location of a magnetometer of the mobile computing device in at least one of a vertical or horizontal direction with respect to the mobile device accessory when the mobile device accessory is coupled to the mobile computing device.

10. The mobile device accessory of claim 8, wherein the reference location is the location of a magnetometer of the mobile computing device when the mobile device accessory is coupled to the mobile computing device.

11. The mobile device accessory of claim 8, wherein the magnetic field produced by the first electromagnetic coil overlaps with the magnetic field produced by the second electromagnetic coil at the reference location when pressure that exceeds a threshold pressure is applied to each of the first and second pieces of piezoelectric material.

12. The mobile device accessory of claim 5, wherein:
the first piece of piezoelectric material is positioned within a first wall of the mobile device accessory, the first wall being configured to engage a first edge of the mobile computing device housing; and
the second piece of piezoelectric material is positioned within a second wall of the mobile device accessory, the second wall being configured to engage a second edge of the mobile computing device housing.

13. The mobile device accessory of claim 5, wherein the first piece of piezoelectric material is electrically isolated from the second piece of piezoelectric material.

14. The mobile device accessory of claim 13, further comprising an electrically non-conductive material that defines the first inner surface and first outer surface, the first and second pieces of piezoelectric material being positioned within the electrically non-conductive material and being electrically isolated by the electrically non-conductive material.

15. The mobile device accessory of claim 5, further comprising a diode along an electrical connection between the first piece of piezoelectric material and the first electromagnetic coil.

16. The mobile device accessory of claim 5, further comprising a capacitor along an electrical connection between the first piece of piezoelectric material and the first electromagnetic coil.

17. The mobile device accessory of claim 5, further comprising a voltage limiter along an electrical connection between the first piece of piezoelectric material and the first electromagnetic coil.

* * * * *